(12) United States Patent
Atishay et al.

(10) Patent No.: US 11,360,840 B2
(45) Date of Patent: Jun. 14, 2022

(54) METHOD AND APPARATUS FOR PERFORMING REDUNDANCY ANALYSIS OF A SEMICONDUCTOR DEVICE

(71) Applicant: Samsung Electronics Co., Ltd., Suwon-si (KR)

(72) Inventors: Atishay, Bangalore (IN); Prasanth B, Bangalore (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/933,514

(22) Filed: Jul. 20, 2020

(65) Prior Publication Data

US 2021/0224146 A1   Jul. 22, 2021

(30) Foreign Application Priority Data

Jan. 20, 2020   (IN) .............................. 202041002300

(51) Int. Cl.
*G06F 11/00*  (2006.01)
*G06F 11/07*  (2006.01)

(52) U.S. Cl.
CPC ........ *G06F 11/079* (2013.01); *G06F 11/0727* (2013.01); *G06F 11/0751* (2013.01); *G06F 11/0787* (2013.01)

(58) Field of Classification Search
CPC .. G06F 11/008; G06F 11/079; G06F 11/3409; G06F 11/3452; G06F 11/3602; G06F 11/0727; G06F 11/0751; G06F 11/0787; G11C 29/72; G11C 29/56008
USPC ..................................................... 714/1–57
See application file for complete search history.

(56) References Cited

U.S. PATENT DOCUMENTS

| 4,627,053 A | 12/1986 | Yamaki et al. |
| 4,751,656 A | 6/1988 | Conti et al. |
| 5,588,115 A | 12/1996 | Augarten |
| 5,795,797 A | 8/1998 | Chester et al. |

(Continued)

FOREIGN PATENT DOCUMENTS

EP   0485976 A2   5/1992

OTHER PUBLICATIONS

Huang, Rei-Fu et al., "Raisin: Redundancy Analysis Algorithm Simulation", IEE Design & Test of Computers, 0740-7475/07, pp. 386-396, Jul.-Aug. 2007.

(Continued)

*Primary Examiner* — Sarai E Butler
(74) *Attorney, Agent, or Firm* — Harness, Dickey & Pierce, P.L.C.

(57) ABSTRACT

Embodiments of present disclosure relates to method and apparatus for performing redundancy analysis of a semiconductor device. For the redundancy analysis, plurality of banks in the semiconductor device is classified to be associated with a cluster from plurality of clusters. The classification is based on one or more attributes associated with the plurality of banks. Further, at least one cluster parameter for the plurality of clusters and at least one bank parameter for the plurality of banks, is determined. One or more algorithms is mapped with the plurality of clusters, based on the at least one cluster parameter and the at least one bank parameter. The redundancy analysis of at least one bank in the plurality of clusters is performed based on the mapping.

16 Claims, 9 Drawing Sheets

(56) References Cited

U.S. PATENT DOCUMENTS

| | | | |
|---|---|---|---|
| 5,841,783 | A | 11/1998 | Suzuki et al. |
| 5,867,435 | A | 2/1999 | Ogino |
| 6,499,118 | B1 | 12/2002 | Michaelson |
| 6,499,120 | B1 | 12/2002 | Sommer |
| 6,714,466 | B2 | 3/2004 | Park et al. |
| 6,940,765 | B2 | 9/2005 | Kyung |
| 7,043,384 | B2 | 5/2006 | Matsushita et al. |
| 7,405,088 | B2 | 7/2008 | Matsushita et al. |
| 8,086,916 | B2 | 12/2011 | Kopel |
| 9,401,222 | B1 * | 7/2016 | Eckert ............... G11C 29/44 |
| 9,666,039 | B2 | 5/2017 | Chen et al. |
| 2001/0010087 | A1 | 7/2001 | Tanaka |
| 2003/0101370 | A1 * | 5/2003 | Schroder ............ G11C 29/808 714/6.32 |
| 2003/0220759 | A1 | 11/2003 | Katayama |
| 2007/0055917 | A1 * | 3/2007 | Kashiwaya ........ G06F 13/4022 714/49 |
| 2009/0006887 | A1 * | 1/2009 | Lee ..................... G11C 29/802 714/5.1 |
| 2009/0024905 | A1 * | 1/2009 | Shalvi ................ G06F 11/1072 714/773 |
| 2009/0049351 | A1 | 2/2009 | Norrod et al. |
| 2009/0144583 | A1 * | 6/2009 | Bruennert ........... G11C 29/789 714/6.32 |
| 2009/0164707 | A1 * | 6/2009 | Norman .................. G11C 5/02 711/103 |
| 2011/0258491 | A1 * | 10/2011 | Doi ................. G01R 31/31935 714/42 |
| 2012/0173920 | A1 * | 7/2012 | Park ..................... G11C 29/82 714/6.11 |
| 2013/0170274 | A1 * | 7/2013 | Yu ......................... G11C 14/00 365/51 |
| 2013/0311831 | A1 * | 11/2013 | Oh ...................... G11C 29/006 714/37 |
| 2015/0121134 | A1 * | 4/2015 | Wipfel ............... G06F 11/2094 714/6.31 |
| 2020/0073564 | A1 * | 3/2020 | Das .................... G06F 11/3447 |

OTHER PUBLICATIONS

Chopra, Anjali "A 3-Step Approach To Determine Infringement of Your Patents In The Marketplace", retrieved on Jul. 20, 2020 <https://www.greyb.com/identify-products-infringing-patents/>.

Kuo, Sy-Yen et al. "Efficient Spare Allocation in Reconfigurable Arrays", Computer Systems Group, 23rd Design Automation Conference, Paper 23.3, pp. 385-390 (1986).

M. Tarr et al., "Defect analysis system speeds test and repair of redundant memories", Reprinted from ELECTRONICS, <https://www.researchgate.net/publication/297151603>, Jan. 12, 1984.

Cho, Hyungjun et al. "A Fast Redundancy Analysis Algorithm in ATE for Repairing Faulty Memories", ETRI Journal, vol. 34, No. 3, pp. 478-481, Jun. 2012.

Kim, Jooyoung et al., "A New Redundancy Analysis Algorithm Using One Side Pivot", Department of Electrical and Electronics Engineering Yonsei University, Nov. 1, 2014.

Huang, Rei-Fu et al., "A Simulator for Evaluating Redundancy Analysis Algorithms of Repairable Embedded Memories", IEEE International Workshop on Memory Technology, Design and Test (MTDT 2002), 1087-4852/02, <https://www.researchgate.net/publication/221520789>.

Huang, Rei-Fu et al., "Raisin: Redundancy Analysis Algorithm Simulation", IEE Design & Test of Computers, 0740-7475/07, pp. 386-396, July-Aug. 2007.

Yamasaki, Kaname et al., "High Quality Simulation Tool for Memory Redundancy Algorithms", pp. 133-138, 2009, <https://www.researchgate.net/publication/228896410>.

Wu, Junjie et al., "A Generalization of Proximity Functions for K-means", Seventh IEEE International Conference on Data Mining, 1550-1786/07, pp. 361-370, <https://www.researchgate.net/publication/4324196>, Nov. 2007.

3 Steps for Detecting Patent Infringement: An Easy Approach, p. 1-8, <https://sagaciousresearch.com/blog/3-steps-detecting-patent-infringement-easy-approach/>, Oct. 23, 2017.

Day, John R., "A Fault-Driven Comprehensive Redundancy Algorithm", 0740-7475/85/0600-0035$01.00 IEEE, p. 35-43, Jun. 1985.

Walker, Hank et al., "Vlasic: A Catastrophic Fault Yield Simulator for Integrated Circuits", IEEE Transactions on Computer-Aided Design vol. CAD-5, No. 4, p. 541 -556, Oct. 1986.

Matushita, H et al., "Highly Sensitive Inspection System for Lithography-Related Faults in Agile-Fab Detecting Algorithm, Monitoring and Evaluation of Yield Impact" IEEE International Symposium on Semiconductor Manufacturing, ISSM 2001. Conference Proceeding, p. 239-242, Oct. 8, 2001.

Nakamae, Koji et al., "Fail Pattern Classification and Analysis System Of Memory Fail Bit Maps", Modeling and Simulation of Microsystems 2001, <(www.cr.org), IBSN 0-9708275-0-4, p. 598-601, Mar. 19, 2001.

Appello, Davide et al., "Embedded Memory Fail Analysis for Production Yield Enhancement" p. 1-5, May 2001.

Kim, Byunghoon et al., "A Regularized Singular Value Decomposition-Based Approach for Failure Pattern Classification on Fail Bit Map in a DRAM Wafer", IEEE Transactions on Semiconductor Manufacturing, p. 1-9, Feb. 2015.

* cited by examiner

METHOD AND APPARATUS FOR PERFORMING REDUNDANCY ANALYSIS OF A SEMICONDUCTOR DEVICE

CROSS-REFERENCE TO RELATED APPLICATION

This application claims the benefit of Indian Patent Application No. 202041002300 filed on Jan. 20, 2020, the disclosure of which is incorporated herein in its entirety by reference.

TECHNICAL FIELD

One or more example embodiments related to a method, a system, an apparatus, and/or non-transitory computer readable medium for performing redundancy analysis of a semiconductor device.

BACKGROUND

Semiconductor devices formed on wafers may be tested using several techniques. Electrical die sorting is one such technique. Electrical die sorting tests and categorizes each semiconductor device in a wafer, based on selected qualities and characteristics. The electrical die sorting includes steps of electrical test, pre-laser, laser repair, post laser, and inking. The electrical tests may examine attributes such as DC voltage and electric current, transistance, resistance, and capacitance. In the process of pre-laser, electrical signals are monitored and the semiconductor device is determined to be functional or faulty, based on the electrical signals. In the laser repair process, the semiconductor devices tagged for repairs in the previous process are zapped by a laser beam to mend discrepancies. Once the repairs are complete, the semiconductor devices are tested again in a post-laser process to ensure that they were repaired properly. In the inking process, the semiconductor devices are marked with inks to easily distinguish defective chips before and after the laser repair process.

The post-laser process and the pre-laser process in the electrical die sorting procedure include redundancy analysis. A semiconductor device includes plurality of banks arranged in rows and columns. In a relatively large array, it can be expected that some banks may not be usable. Accordingly, redundant banks can be analyzed via the redundancy analysis and repaired. Existing methods of redundancy analysis may include testing banks with different types of failure states and storing the failure information associated with such banks. Based on the fail information, a plurality of repair solutions is produced to repair the banks. The fail information along with the repair solution may be communicated with a repair equipment for the semiconductor device, to take-up the repair of the banks.

However, with increase in density of a semiconductor device, probability of error on the semiconductor device increases. In addition, with the 64 Kbit generation, banks, such as Dynamic Random-Access Memory (DRAM) arrays, include redundancies that provide tolerance of minor fabrication defects. The repair solutions, produced for the banks with the fail information, include different algorithms for the banks. Such repair solutions may provide highest yield solution but time complexity of corresponding algorithm is also high. Further, with uniform algorithm used for the banks, repair time for whole wafer may be increased.

The information disclosed in this background of the disclosure section is only for enhancement of understanding of the general background of the invention and should not be taken as an acknowledgement or any form of suggestion that this information forms the prior art already known to a person skilled in the art.

SUMMARY

In an embodiment, the present disclosure relates to a method of performing redundancy analysis of a semiconductor device by classifying at least one of a plurality of banks in a semiconductor device to be associated with a cluster from plurality of clusters wherein the classification is based on one or more attributes associated with the plurality of banks, determining at least one cluster parameter for the plurality of clusters and at least one bank parameter for the plurality of banks, mapping one or more algorithms with the plurality of clusters, based on the at least one cluster parameter and the at least one bank parameter, identifying a repair solution from the redundancy analysis of the at least one bank.

In an embodiment, the present disclosure relates to an analysis apparatus for performing redundancy analysis of a semiconductor device. The analysis apparatus comprises a processor and a memory communicatively coupled to the processor. The memory stores processor-executable instructions, which, on execution, cause the processor to perform the redundancy analysis. For the redundancy analysis, a plurality of banks in the semiconductor device is classified to be associated with a cluster from plurality of clusters. The classification is based on one or more attributes associated with the plurality of banks. Further, at least one cluster parameter for the plurality of clusters and at least one bank parameter for the plurality of banks are determined. One or more algorithms is mapped with the plurality of clusters, based on the at least one cluster parameter and the at least one bank parameter. The redundancy analysis of at least one bank in the plurality of clusters is performed based on the mapping.

In an embodiment, the present disclosure related to a method of wafer scale redundancy analysis by classifying banks into at least one cluster from among a plurality of clusters based on at least one of the position and the error rate of at least one of the banks, determining at least one cluster parameter for the at least one cluster, determining at least one bank parameter for the classified bank, selecting from an Algorithm Map, an appropriate redundancy analysis algorithm for the classified bank based on the at least one cluster parameter and the at least one bank parameter, and applying the redundancy analysis algorithm to the classified bank for identifying a reparation solution for the classified bank.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE ACCOMPANYING DRAWINGS

The accompanying drawings, which are incorporated in and constitute a part of this disclosure, illustrate example embodiments and, together with the description, serve to explain the disclosed principles. In the figures, the left-most digit(s) of a reference number identifies the figure in which the reference number first appears. Some embodiments of system and/or methods in accordance with embodiments of the present subject matter are now described, by way of example only.
Client FIG. 1 shows example environment of an analysis apparatus for performing redundancy analysis of a semiconductor device, in accordance with some embodiments of the present disclosure;

Figure 1:
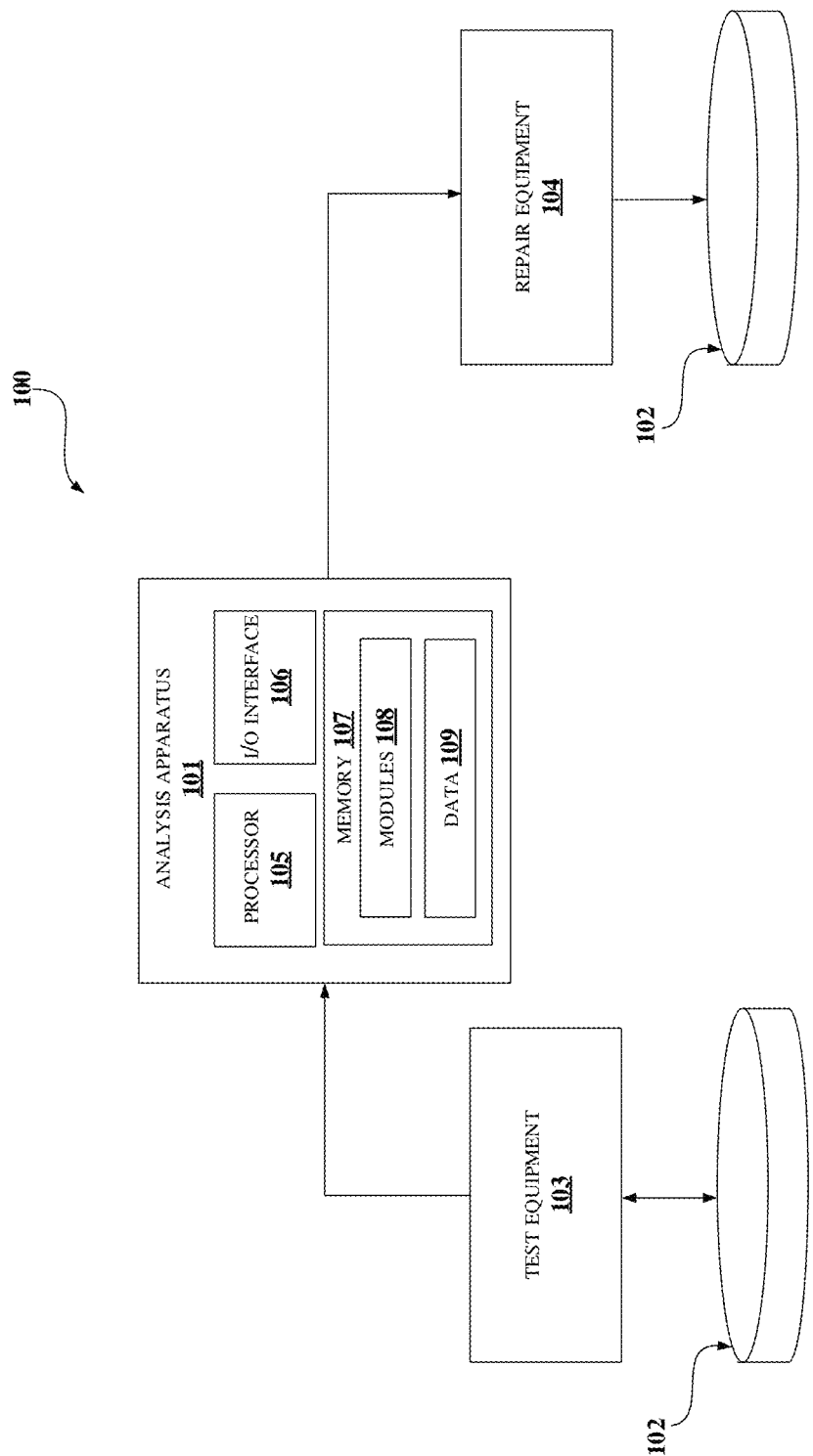

It should be appreciated by those skilled in the art that any block diagrams herein represent conceptual views of illustrative systems embodying the principles of the present subject matter. Similarly, it will be appreciated that any flow charts, flow diagrams, state transition diagrams, pseudo code, and the like represent various processes that may be substantially represented in computer readable medium and executed by a computer or processor, whether such a computer or processor is explicitly shown.

DETAILED DESCRIPTION

While the disclosure is susceptible to various modifications and alternative forms, specific embodiment thereof has been shown by way of example in the drawings and will be described in detail below. It should be understood, however that it is not intended to limit the disclosure to the forms disclosed, but on the contrary, the disclosure is to cover all modifications, equivalents, and alternative falling within the spirit and the scope of the disclosure.

The terms "comprises," "comprising," or any other variations thereof, are intended to cover a non-exclusive inclusion, such that a setup, device, or method that comprises a list of components or steps does not include only those components or steps but may include other components or steps not expressly listed or inherent to such setup or device or method. In other words, one or more elements in a system or apparatus proceeded by "comprises . . . a" does not, without more constraints, preclude the existence of other elements or additional elements in the system or method.

The terms "includes," "including," or any other variations thereof, are intended to cover a non-exclusive inclusion, such that a setup, device, or method that includes a list of components or steps does not include only those components or steps but may include other components or steps not expressly listed or inherent to such setup or device or method. In other words, one or more elements in a system or apparatus proceeded by "includes . . . a" does not, without more constraints, preclude the existence of other elements or additional elements in the system or method.

When an element is referred to as being "coupled to" another element, the element may be directly coupled to the other element or one or more other intervening elements may be present. In contrast, when an element is referred to as being "directly on," "directly connected to," "directly coupled to," or "immediately adjacent to," another element there are no intervening elements present.

In the following detailed description of the embodiments of the disclosure, reference is made to the accompanying drawings that form a part hereof, and in which are shown by way of illustration specific embodiments in which the disclosure may be practiced. These embodiments are described in sufficient detail to enable those skilled in the art to practice the disclosure, and it is to be understood that other embodiments may be utilized and that changes may be made without departing from the scope of the present disclosure. The following description is, therefore, not to be taken in a limiting sense.

Present disclosure proposes methods and apparatuses for performing redundancy analysis of a semiconductor device. A method includes analyzing the banks before performing the step of redundancy analysis. The analysis includes to cluster the banks based one, for example, errors and position, and to rank one or more algorithms for the clusters. Using the ranked one or more algorithms, repair solutions for the banks may be identified. By the proposed disclosure, wafer repair timings and efficiency of redundancy analysis may be improved.

FIG. 1a shows an example environment 100 of an analysis apparatus 101. The analysis apparatus 101 may be configured to perform redundancy analysis of a semiconductor device on a wafer 102. The example environment 100 includes the wafer 102, test equipment 103, the analysis apparatus 101 and repair equipment 104. In an embodiment, the example environment 100 illustrates procedure of repairing a semiconductor device. The wafer 102 may be a slice of a substrate with one or more semiconductor devices. Each of the one or more semiconductor devices includes a plurality of banks (also referred to as a plurality of memory cells). The plurality of banks may be arranged in rows and columns in corresponding semiconductor device. The test equipment 103 may be configured to test the one or more semiconductor devices to determine one or more attributes associated with the plurality of banks. In an embodiment, the one or more attributes may be related to error associated with each of the plurality of banks. In an embodiment, the one or more attributes may include at least one of the error position data, the error rate data, the error type data and the error pattern data associated with each of the plurality of banks. In an embodiment, the error of a bank may also be referred to as the failure of the bank. In an embodiment, the test equipment 103 may be configured to determine other attributes associated with the plurality of banks. For example, the other attributes may include the distance of each of the plurality of banks from a centroid of corresponding semiconductor device, the position of the semiconductor device on the wafer and so on. One or more techniques, known to a person skilled in the art, may be implemented in the test equipment 103 to determine the one or more attributes. The determined one or more attributes may be stored in a repository associated with the analysis apparatus 101 (not shown in the figure). The analysis apparatus 101 may retrieve the one or more attributes from the repository. In an embodiment, the analysis apparatus 101 may be configured to communicate with the test equipment 103, in real-time, to receive the one or more attributes.

Using the one or more attributes, the analysis apparatus 101 may be configured to perform the redundancy analysis of the plurality of banks in the one or more semiconductor devices in the wafer 102. The analysis apparatus 101 may include a processor 105, I/O interface 106 and a memory 107. In some embodiments, the memory 107 may be communicatively coupled to the processor 105. The memory 107 may store instructions, executable by the processor 105, which on execution, may cause the analysis apparatus 101 to perform the redundancy analysis of the plurality of banks. In an embodiment, the memory 107 may include one or more modules 108 and data 109. The one or more modules 108 may be configured to perform the steps of the present disclosure using the data 109, to perform the redundancy analysis as disclosed in the present disclosure. In an embodiment, each of the one or more modules 108 may be a hardware unit that may be outside the memory 107 and coupled with the analysis apparatus 101.

The analysis apparatus 101 and the one or more modules 108 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), an electronic circuit, Programmable System-on-Chip (PSoC), a combinational logic circuit, etc. The analysis apparatus 101 may be a variety of computing systems, such as a laptop computer, a desktop computer, a Personal Computer (PC), a notebook, a smartphone, a tablet, e-book readers, a server, a network server, and the like.

For performing the redundancy analysis, the analysis apparatus 101 may be configured to classify each of the plurality of banks in a semiconductor device, from the one or more semiconductor devices, to be associated with a cluster from plurality of clusters. The classification may be based on the one or more attributes associated with a plurality of banks. In an embodiment, each of the plurality of clusters may be formed by clustering one or more banks from a plurality of banks, using a clustering technique. In an embodiment, at least one clustering technique known to a person skilled in the art may be implemented for forming the plurality of clusters. For example, the clustering techniques may include, but are not limited to, K-means clustering, hierarchical clustering, Partitioning Around Medoids (PAM) and so on. In an embodiment, for classifying a bank from the plurality of banks, cluster scores may be computed for the bank. The cluster scores are computed with respect to each of the plurality of clusters. The bank is classified to be associated with a cluster relating to a cluster score with least value amongst values of the cluster scores. In an embodiment, the cluster score of a bank with respect to a cluster may be determined based on one or more factors relating to the bank and the cluster. In an embodiment, the one or more factors may include, but are not limited to, the distance of the bank from centroid of the cluster, the error difference between the bank and the centroid of the cluster, the weight associated with the distance and the error difference, etc. In an embodiment, commonly occurring error patterns amongst the plurality of banks may be used for classifying a bank to be associated with a cluster.

Upon the classification, the analysis apparatus 101 may be configured to determine at least one cluster parameter for each of the plurality of clusters. In an embodiment, the at least one cluster parameter may include, but is not limited to, at least one of the cluster size data, the cluster position data, the cluster type data and the mean error data associated with each of the plurality of clusters. Further, the analysis apparatus 101 may be configured to determine at least one bank parameter for each of the plurality of banks. In an embodiment, the at least one bank parameter may include, but is not limited to, at least one of the error division data, the number of errors and the error pattern. One or more techniques, known to a person skilled in the art, may be implemented in the analysis apparatus 101 to determine the at least one bank parameter and the at least one cluster parameter.

Upon determining the at least one bank parameter and the at least one cluster parameter, the analysis apparatus 101 may be configured to map one or more algorithms with each of the plurality of clusters. In an embodiment, the one or more algorithms may also be referred to as redundancy analysis algorithms. In an embodiment, the one or more algorithms may be retrieved from a repository associated with the analysis apparatus. In an embodiment, the repository may be referred to as algorithm map. The mapping may be performed based on the at least one cluster parameter and the at least one bank parameter. In an embodiment, the analysis apparatus 101 may perform the mapping of the one or more algorithms for the plurality of clusters, by generating an analysis table comprising the one or more algorithms and one or more analysis attributes, for each of the plurality of clusters. In an embodiment, the one or more analysis attributes and the one or more algorithms for each of the plurality clusters is selected based on at least one cluster parameter and the at least one bank parameter. Further, based on the analysis table, the one or more algorithms are ranked for performing the redundancy analysis of a corresponding cluster. Upon the ranking, the analysis apparatus 101 performs the redundancy analysis. The redundancy analysis is performed on at least one bank in the plurality of clusters. For a bank in a cluster, the one or more algorithms ranked for the cluster is used for performing the redundancy analysis of the bank. The one or more algorithms are applied on the banks. By this, repair solution for the error associated with the bank may be identified. Similarly, each and every bank in the semiconductor device is applied with corresponding one or more algorithms, to identify corresponding repair solutions.

In an embodiment, the repair solutions identified by performing the redundancy analysis are communicated with the repair equipment 104 in the example environment 100. Using the repair solutions, the plurality of banks in the semiconductor device on the wafer 102, may be repaired by the repair equipment 104. In an embodiment, the repair equipment 104 may be a laser-based repair equipment.

In an embodiment, the analysis apparatus 101 may be a dedicated server or a cloud-based server in communication with the test equipment 103 and the repair equipment 104. The analysis apparatus 101 may communicate with at least one of the test equipment 103 and the repair equipment 104 via a communication network (not shown in figure). The communication network may include, but is not limited to, a direct interconnection, a Peer to Peer (P2P) network, Local Area Network (LAN), Wide Area Network (WAN), wireless network (e.g., using Wireless Application Protocol), Controller Area Network (CAN), the Internet, Wi-Fi, and such. In an embodiment, the analysis apparatus 101 may be integral part of at least one of the test equipment 103 and the repair equipment 104. The I/O interface 106 of the analysis apparatus 101 may assist in transmitting and receiving data. Received data may include, but is not limited to, the one or more attributes from the test equipment 103. Transmitted data may include, but is not limited to, the identified repair solutions to the repair equipment 104. One or more other data, which is associated with the redundancy analysis performed by the analysis apparatus, may be received and transmitted via the I/O interface 106.

Figure 2:
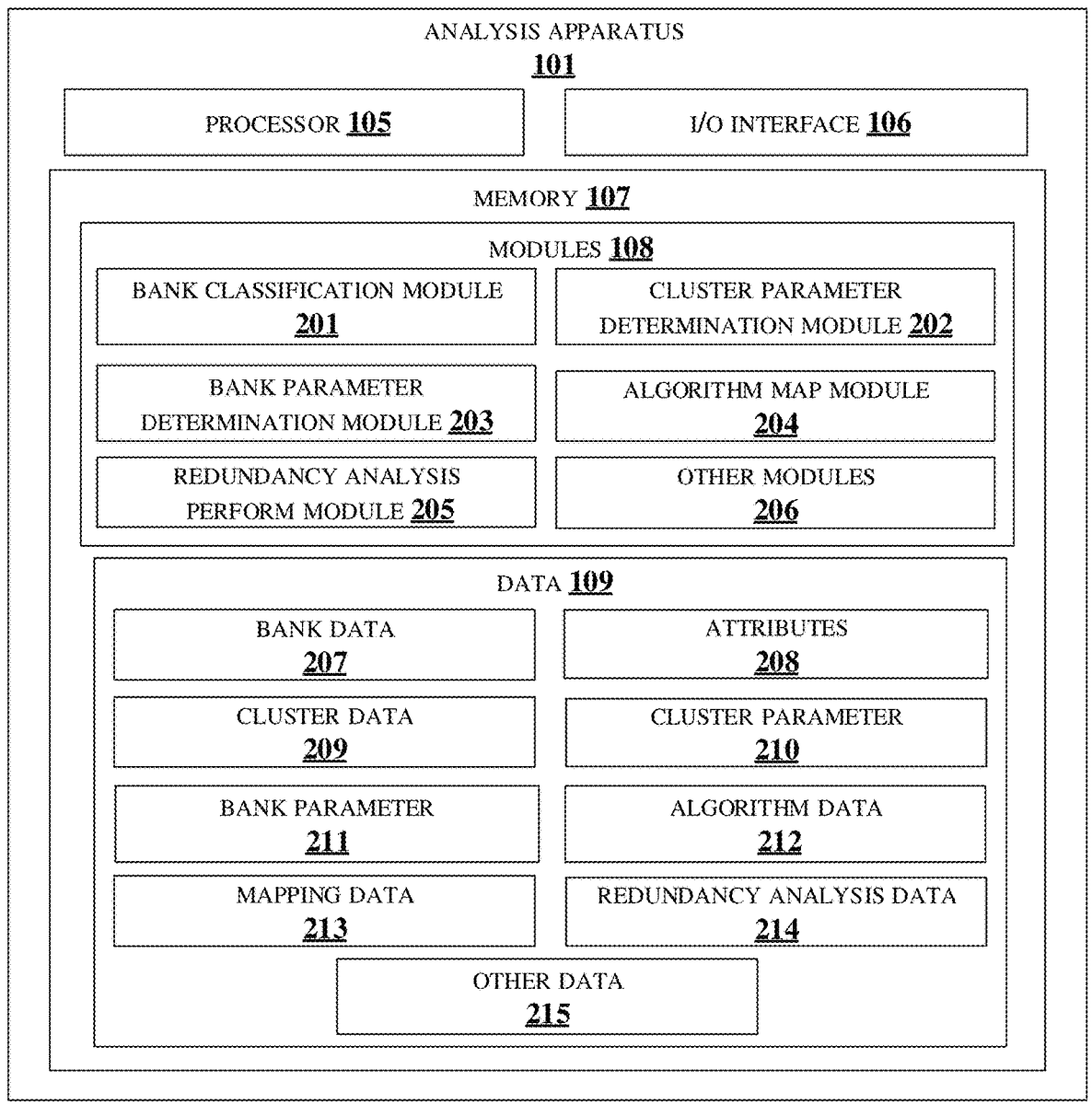
FIG. 2 shows a detailed block diagram of an analysis apparatus for performing redundancy analysis of a semiconductor device, in accordance with some embodiments of the present disclosure.

FIG. 2 shows a detailed block diagram of the analysis apparatus 101 for performing redundancy analysis of the semiconductor device, in accordance with some embodiments of the present disclosure.

The data 109 and the one or more modules 108 of the analysis apparatus 101 may be described herein in detail. In one implementation, the one or more modules 108 may include, but are not limited to, a bank classification module 201, a cluster parameter determination module 202, a bank parameter determination module 203, an algorithm map module 204, a redundancy analysis perform module 205 and one or more other modules 206 associated with the analysis apparatus 101.

In an embodiment, the data 109 in the memory 107 may include bank data 207, attributes 208 (also referred to as one or more attributes 208), cluster data 209, cluster parameter 210 (also referred to as at least one cluster parameter 210), bank parameter 211 (also referred to as at least one bank parameter 211), algorithm data 212 (also referred to as one or more algorithms 212), mapping data 213, redundancy analysis data 214, and other data 215 associated with the analysis apparatus 101.

In an embodiment, the one or more modules 108 of the analysis apparatus 101 may process the data 109 in the memory 107. In an embodiment, the one or more modules 108 may be implemented as dedicated units and when implemented in such a manner, said modules may be configured with the functionality defined in the present disclosure to result in a novel hardware. As used herein, the term module may refer to an Application Specific Integrated Circuit (ASIC), an electronic circuit, a Field-Programmable Gate Arrays (FPGA), Programmable System-on-Chip (PSoC), a combinational logic circuit, and/or other suitable components that provide the described functionality.

Electrical die sorting technique may be implemented on a semiconductor device to test and repair the semiconductor device. The semiconductor device may include a plurality of banks that may be memory cells. The memory cells may include any memory device such as DRAM, SDRAM, SRAM, MRAM, FRAM, Flash, EEPROM, and PCRAM. Information associated with each of the plurality of banks may be stored as the bank data 207 in the memory 107. The electrical die sorting technique includes determining errors in the plurality of banks and performing redundancy analysis on the plurality of banks to identify repair solutions. Further, the repair solutions are applied on the plurality of banks to repair the plurality of banks. The analysis apparatus 101 of the present disclosure provision an efficient method for performing the redundancy analysis.

The bank classification module 201 of the analysis apparatus 101 is configured to classify the plurality of banks in the semiconductor device to be associated with a cluster from plurality of clusters. The classification may be based on the one or more attributes 208 associated with the plurality of banks. In an embodiment, the one or more attributes 208 may include, but are not limited to, at least one of the error position data, the error rate data and the error pattern data associated with each of the plurality of banks, and the distance of each of the plurality of the banks from a centroid of the semiconductor device.

Initially, the bank classification module 201 may be configured to form the plurality of clusters by clustering one or more banks from the plurality of banks. Information of the plurality of clusters may be stored as the cluster data 209 in the memory 107. One or more clustering techniques, known to a person skilled in the art, may be implemented for forming the plurality of clusters. The one or more clustering techniques may include, but are not limited to, K-means clustering, hierarchical clustering, Partitioning Around Medoids (PAM) and so on. In a preferred embodiment, the K-means clustering technique may be implemented for forming the plurality of clusters. K-means clustering aims to partition N observations into k clusters in which each observation belongs to a cluster with nearest mean.

In an embodiment, the bank classification module 201 may be configured to assess the quality of the cluster and clustering technique implemented in the analysis apparatus 101. For the assessment, purity factor may be determined. In an embodiment, the purity factor may be an external evaluation criterion used for finding clustering accuracy. The purity factor may be determined using equation (1) given below:

$$\text{Purity} = \frac{1}{N} \sum_{j=1}^{k} \max_j (n_j^i) \quad (1)$$

where, N is number of semiconductor devices in a wafer;

k is the number of clusters; and $n_j^i$ is the number of banks in cluster j with label i.

In an embodiment, value of the purity factor may vary from zero (0) to one (1). When the value of the purity factor is 1, it may be depicted that the plurality of clusters are formed such that the plurality of banks are clustered correctly. When the value of purity factor is 0, it may be depicted that none of the plurality of banks are clustered correctly.

Figure 3:
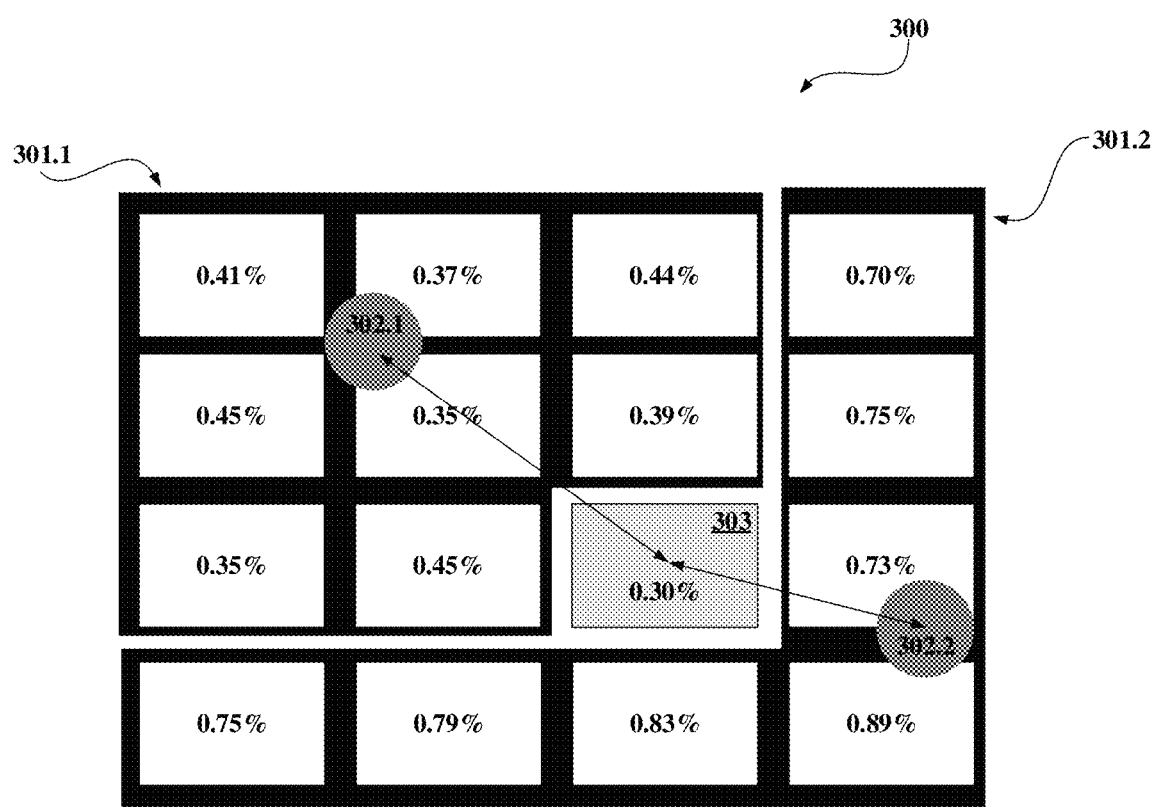
FIG. 3 shows example embodiment for classifying plurality of banks in a semiconductor device, in accordance with some embodiments of the present disclosure.

In an embodiment, for classifying a bank from the plurality of banks, cluster scores may be computed for the bank. FIG. 3 shows an example embodiment for classifying the plurality of banks in a semiconductor device 300, in accordance with some embodiments of the present disclosure. The semiconductor device 300 may include plurality of banks. Using a clustering technique, a first cluster 301.1 and a second cluster 301.2 may be formed. Consider a bank 303 needs to be classified to be associated with one of the first cluster 301.1 and the second cluster 301.2. For the classification, cluster scores may be determined for the bank 303. The cluster scores may include a first cluster score associated with the first cluster 301.1 and a second cluster score associated with the second cluster 301.2. The first cluster score may be determined based on distance and error associated with the bank 303 and the first cluster 301.1. The second cluster score may be determined based on distance and error associated with the bank 303 and the second cluster 301.2. In an embodiment, the cluster scores may be computed using equation (2) given below:

$$S_i = \frac{E_i \times E_s}{\sum_{i=1}^{n} E_i} + \frac{D_i \times D_s}{\sum_{i=1}^{n} D_i} \quad (2)$$

where i indicates the $i^{th}$ cluster;

$D_i$ indicates distance of bank from the centroid of the $i^{th}$ cluster;

$\Sigma_{i=1}^{n} D_i$ is the sum of the distances between the bank and the centroids of the n clusters;

$E_i$ indicates the error difference between the bank and the centroid of the $i^{th}$ cluster;

$\Sigma_{i=1}^{n} E_i$ is the sum of error difference between the bank and the centroids of the n clusters;

$D_s$ indicates the score parameter for defining the weightage of the distance of the bank from the $i^{th}$ cluster; and $E_s$ indicates the score parameter for defining the weightage of the error difference between the bank and the centroid of the $i^{th}$ cluster.

For example, if the value of $E_s$ is 10 and the value of $D_s$ is 1, the error is given more importance than the distance. If the distance between the bank 303 and the centroid of the first cluster 301.1 is 3 and the distance between the bank 303 and the centroid of the second cluster 301.2 is 2, then the sum of distances between the bank and centroid of the plurality of clusters is 60. Further, if the error difference between the bank and the centroid of the first cluster 301.1 is 0.40% and the error difference between the bank and the centroid of the second cluster 301.2 is 0.78% then the sum of the error difference between the bank and centroids of the plurality of clusters is 8.65. Using equation (2), the first cluster score of the bank 303 with respect to the first cluster 301.1 may be computed as 0.17 and the second cluster score of the bank 303 with respect to the second cluster 301.2 may be computed as 0.59. Thus, the bank 303 may be classified to be associated with the first cluster 301.1, since the first cluster score is lesser than the second cluster score.

In an embodiment, the bank classification module 201 may be configured to initialize medians for the plurality of clusters for the classification. The centers of each of the plurality of banks are checked to be either stable or unstable. If the centers of each of the plurality of banks are determined to be stable, the bank classification module 201 may identify the plurality of clusters to be accurate. When the centers of at least one bank from the plurality of banks is determined to be unstable, the bank classification module 201 may be configured to compute the cluster scores for the at least one bank which is identified to be unstable. Further, the at least one bank is assigned to a cluster which is related to minimum value/least value amongst values of the cluster scores. Upon assigning the at least one bank to corresponding clusters, the bank classification module 201 may be configured to center the medians of the plurality of clusters and determine error average. Further check on the centers of the plurality of banks to be one of stable and unstable is performed to assign cluster to banks that are determined to be unstable. Such assigning of the clusters to the banks is repeated until centers of all the banks are determined to be stable.

Figure 4A:
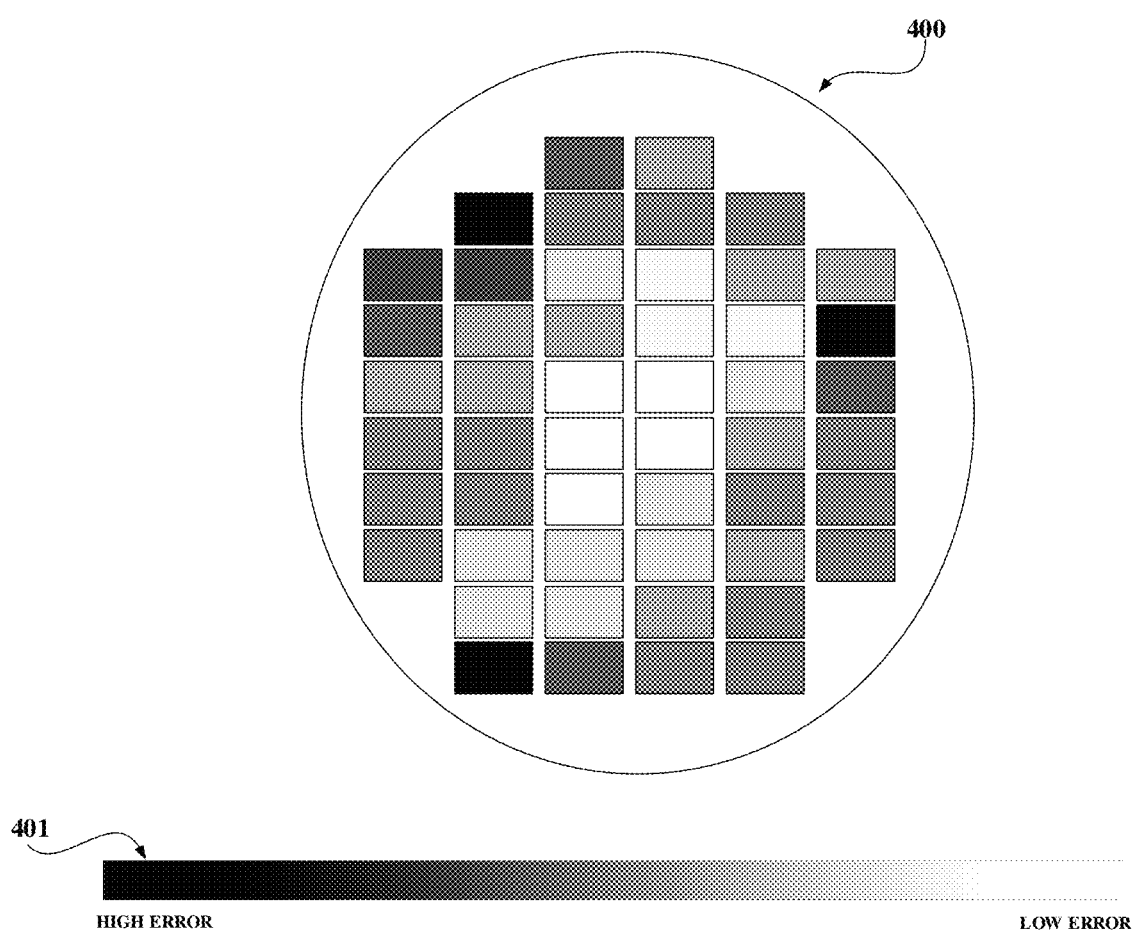
FIGS. 4a and 4b show example embodiments for classifying plurality of banks in a semiconductor device, in accordance with some embodiments of the present disclosure.
Figure 4B:
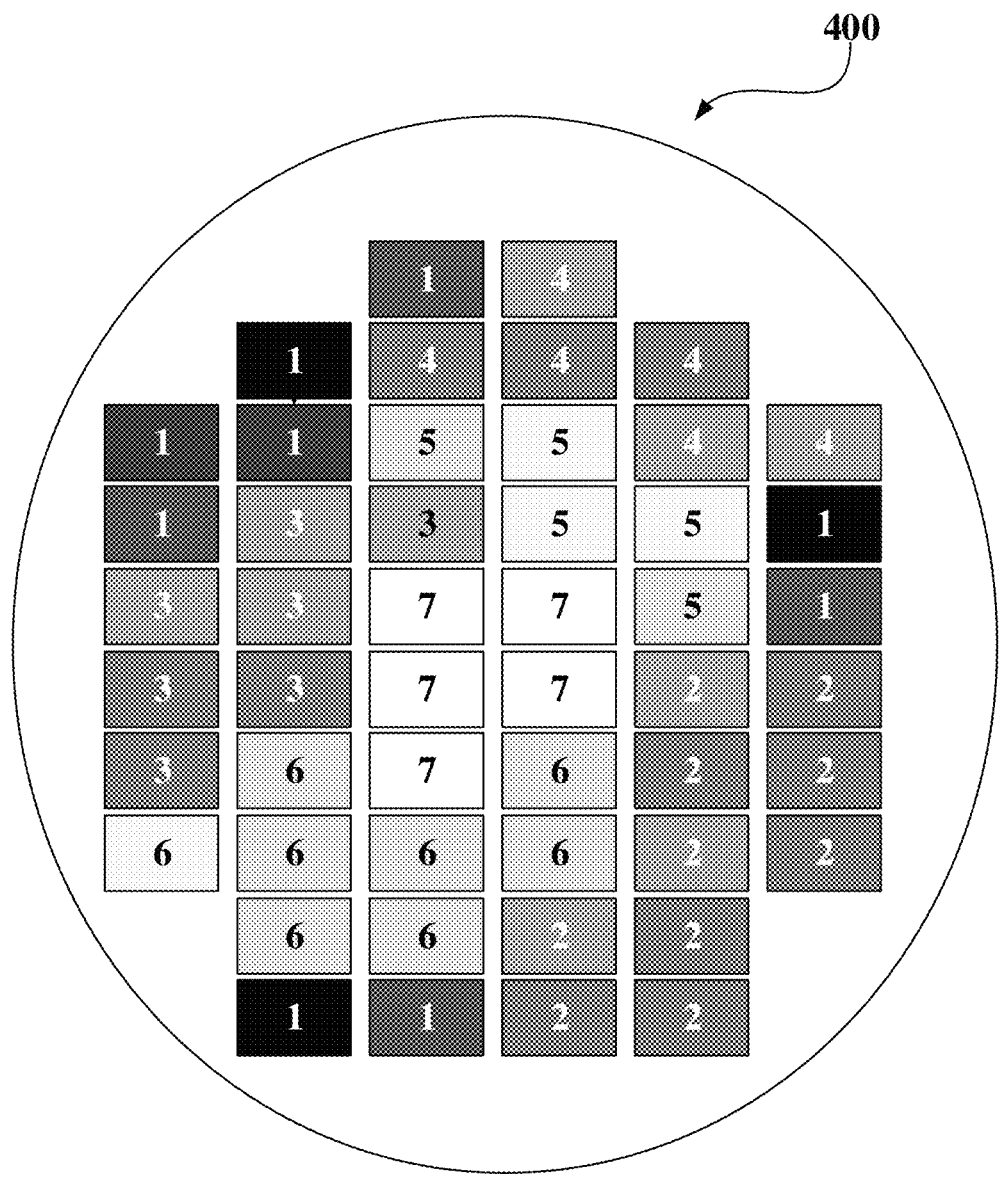

Consider the plurality of banks 400 as shown in FIG. 4a, each of the plurality of banks is associated with an error. Each of the plurality of banks is shaded as per a percentage of the error indicated in gradient 401. Darker shaded banks are associated with a higher percentage of error and lighter shaded banks are associated with a lower percentage of error. The bank classification module 201 may use k-means clustering, and the plurality of banks 400 may be clustered to form the plurality of clusters. If the value of k is 7, then the number of the plurality of clusters is 7. The plurality of clusters may be cluster 1, cluster 2, cluster 3, cluster 4, cluster 5, cluster 6, and cluster 7. FIG. 4b illustrates the plurality of banks associated with the plurality of clusters. The cluster 1 includes all the banks lying in edge with higher percentage of error. It may be noted that the distances between the banks in the cluster 1 are not comparatively small. Banks from different corners of the semiconductor device may belong to same cluster depending on number of failed bits in said banks. Further, the cluster 7 includes all the banks in the center with lower percentage of error. Such banks may be grouped together both because they are close to each other and because they have the same kind of error.

In an embodiment, the bank classification module 201 may be configured to perform the classification based on common patterns in the banks, in and across the wafer. For such classification, the bank classification module 201 may be configured to analyze commonly occurring patterns and banks with these patterns are subjected to be clustered together. In an embodiment, the error pattern associated with a previous redundancy analysis may be stored and used in real-time to analyze the pattern in the banks.

Upon the classification, the cluster parameter determination module 202 of the analysis apparatus 101 may be configured to determine at least one cluster parameter 210 for each of the plurality of clusters. In an embodiment, the at least one cluster parameter 210 may include, but is not limited to, at least one of cluster size data, cluster position data, cluster type data and mean error data associated with each of the plurality of clusters. In an embodiment, the cluster size data of a cluster may indicate number of banks in each of the plurality of clusters. In an embodiment, the cluster position data of the cluster may indicate mean distance of the banks in the cluster with centroid of the wafer. In an embodiment, the cluster type data of the cluster may indicate type of the cluster that may be one of an arc, a segment, a line, and so on. In an embodiment, the mean error data of the cluster may indicate mean error percentage of all the banks in the cluster.

Further, the bank parameter determination module 203 of the analysis apparatus 101 may be configured to determine at least one bank parameter 211 for each of the plurality of banks. In an embodiment, the at least one bank parameter 211 may include, but is not limited to, at least one of error division data, number of errors and error pattern. In an embodiment, the error division data of a bank may indicate the number of rows, columns, and single bit isolated and segment errors in the bank. In an embodiment, the number of errors of the bank may indicate total number of failed bits in the bank. In an embodiment, the error pattern of the bank may indicate reoccurring and common patterns associated with the bank. In an embodiment, the error pattern may indicate common patterns associated with all the banks in the semiconductor device.

Upon determining the at least one bank parameter 211 and the at least one cluster parameter 210, the algorithm map module 204 of the analysis apparatus 101 may be configured to map the one or more algorithms 212 with each of the plurality of clusters, based on the at least one cluster parameter 210 and the at least one bank parameter 211. In an embodiment, the algorithm map module 2-4 may perform the mapping of the one or more algorithms 212 for the plurality of clusters, by generating an analysis table comprising the one or more algorithms 212 and one or more analysis attributes, for each of the plurality of clusters. In an embodiment, the analysis attributes may include repair time, number of solutions and reparability. In an embodiment, the analysis table may be tabulated by running different algorithms on all the banks in all the plurality of clusters. A map is created for each group of parameters, and the one or more algorithms are ranked for each cluster based on the one or more analysis attributes, which may include the repair time, the number of solutions, and the reparability. An example illustration of the analysis table may be as shown in Table 1 below:

TABLE 1

| Cluster parameter data | | | Bank parameter data | | | | One or more analysis attributes | | |
|---|---|---|---|---|---|---|---|---|---|
| Cluster type data | Cluster size data | Cluster position data | Bank error | Row error | Column error | Algorithm | Repair time | Solution | Reparability |
| Arc | 17 | 7 | 271 | 54 | 12 | Fast | 3453 | 1 | 0.93 |
|  |  |  |  |  |  | Fault driven | 9421 | 2 | 0.98 |
|  |  |  |  |  |  | Broadside | 2109 | 1 | 0.75 |
| Line | 19 | 26 | 453 | 67 | 0 | Fast | 4564 | 1 | 0.91 |
|  |  |  |  |  |  | Fault driven | 19854 | 3 | 0.94 |
|  |  |  |  |  |  | Broadside | — | 0 | 0.65 |
| Other | 31 | 18 | 209 | 17 | 9 | Fast | 3110 | 1 | 0.94 |
|  |  |  |  |  |  | Fault driven | 7564 | 5 | 0.99 |
|  |  |  |  |  |  | Broadside | 1108 | 1 | 0.79 |

In an embodiment, upon generating the analysis table, a key and value pair may be generated for each of the plurality of clusters using the analysis table. The key may contain the at least one cluster parameter and the at least one bank parameter. The value may contain ranked algorithms used in case another cluster has similar features. An example representation of the key and value pair is illustrated equation 3 given below:

$$\left\{ \left( \frac{\text{cluster parameter data}}{\text{bank parameter data}} \right), \text{(ranked algorithms)} \right\} \quad (3)$$

In an embodiment, the mapping data 213 in the memory 107 may include the analysis table, the one or more analysis attributes, and the key and value pair associated with each of the plurality of clusters.

Upon the ranking, the redundancy analysis perform module 205 may be configured to perform the redundancy analysis based on the mapping. The redundancy analysis may be performed on each bank in the plurality of clusters. For a bank in a cluster from the plurality of clusters, the one or more algorithms 212, ranked for the cluster, may be used for performing the redundancy analysis of the bank in the cluster. The one or more algorithms 212 may be applied on the banks. By this, repair solution for the error associated with the bank may be identified. Similarly, each and every bank in the semiconductor may be applied with a corresponding algorithm or algorithms, to identify corresponding repair solutions. Output of the redundancy analysis perform module 205 may be stored as the redundancy analysis data 214 in the memory 108. In an embodiment, the redundancy analysis data 214 may be used for repairing each of the plurality of banks in the semiconductor devices.

The other data 215 may store data, including temporary data and temporary files, generated by modules for performing the various functions of the analysis apparatus 101. The one or more modules 108 may also include other modules 206 to perform various miscellaneous functionalities of the analysis apparatus 101. It will be appreciated that such modules may be represented as a single module or a combination of different modules.

Figure 5A:
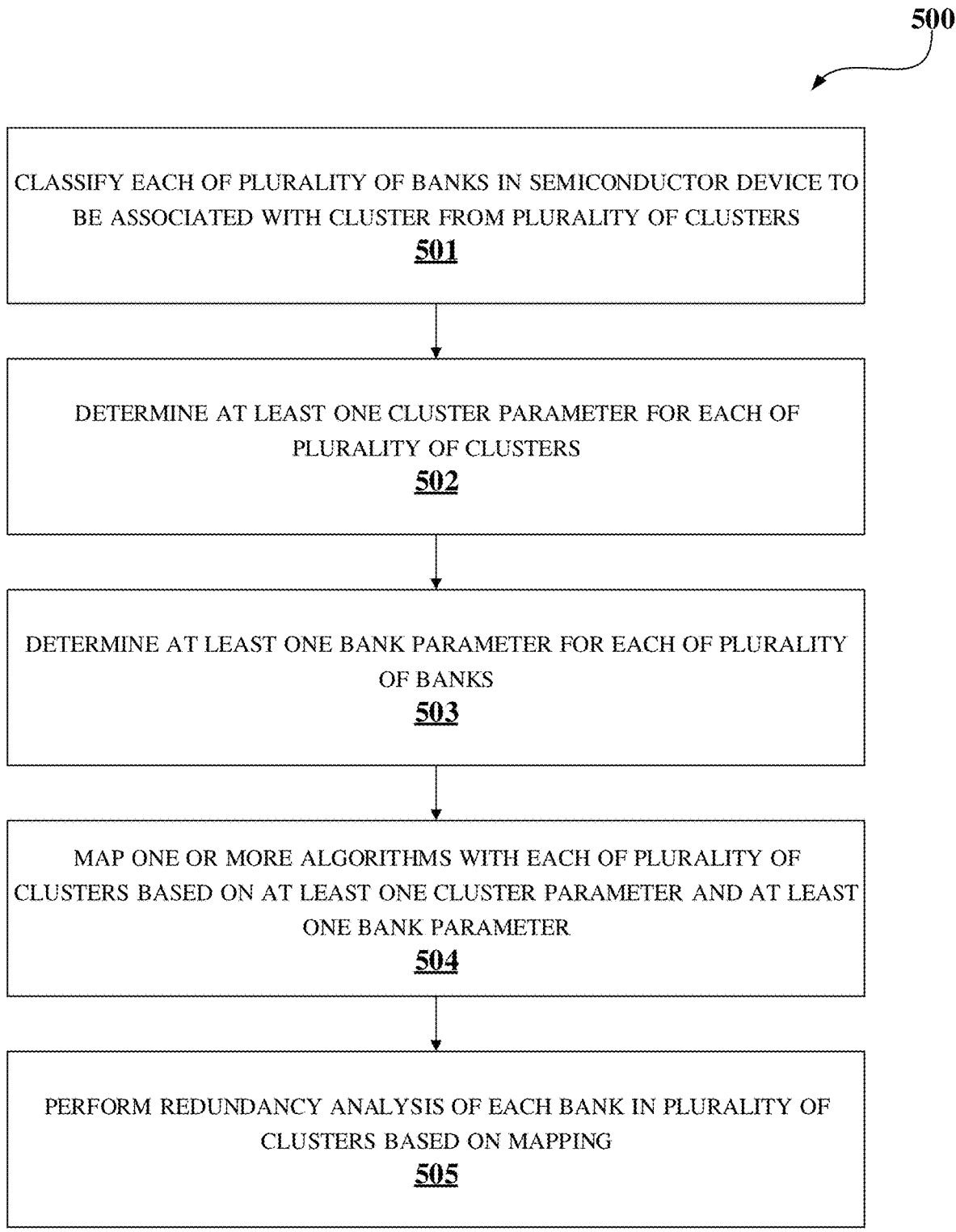
FIG. 5a shows a flow diagram illustrating method for performing redundancy analysis of a semiconductor device, in accordance with some embodiments of present disclosure.

FIG. 5a illustrates a flowchart showing an example method 500 of the analysis apparatus 101 for performing redundancy analysis of a semiconductor device, in accordance with some embodiments of present disclosure.

Figure 5B:
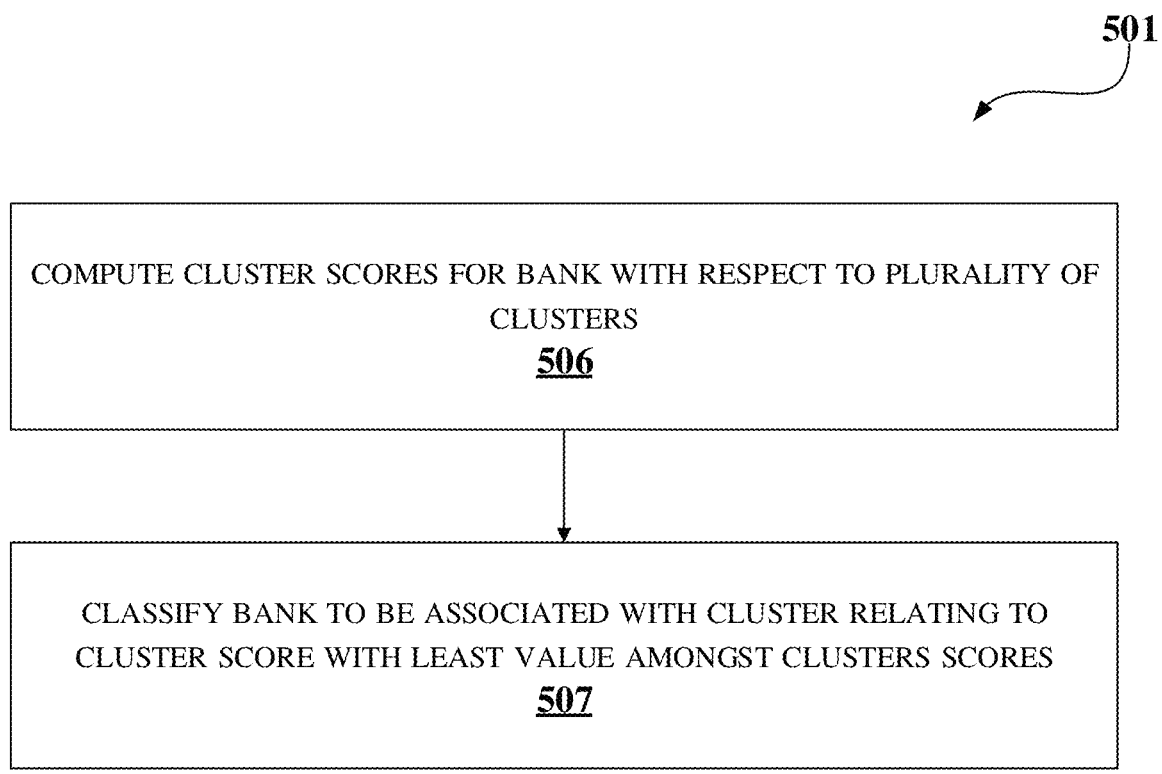
FIG. 5b shows a flow diagram illustrating example method for classifying plurality of banks in a semiconductor device, in accordance with some embodiments of present disclosure.

At block 501, the bank classification module 201 of the analysis apparatus 101 may be configured to classify each of a plurality of banks in a semiconductor device to be associated with a cluster from the plurality of clusters. The classification may be based on one or more attributes 208 associated with the plurality of banks. In an embodiment, the one or more attributes 208 may include at least one of error position data, error rate data and error pattern data associated with each of the plurality of banks, and distance of each of the plurality of banks from a centroid of the semiconductor device. FIG. 5b shows a flow diagram illustrating example method for classifying the plurality of banks, in accordance with some embodiments of present disclosure.

At block 506 of FIG. 5b, the bank classification module 201 of the analysis apparatus 101 may be configured to compute cluster scores for the bank with respect to the plurality of clusters. The cluster score may be determined with respect to each of the plurality of clusters. In an embodiment, the cluster score of a bank for a cluster may be determined based on the distance of the bank from centroid of cluster and error difference associate with the bank and the cluster.

At block 507 of FIG. 5b, the bank classification module 201 of the analysis apparatus 101 may be configured to classify the bank to be associated with a cluster relating to a cluster score with the least value amongst the cluster scores.

Referring back to FIG. 5a, at block 502, the cluster parameter determination module 202 of the analysis apparatus 101 may be configured to determine at least one cluster parameter 210 for each of the plurality of clusters. In an embodiment, the at least one cluster parameter 210 may include at least one of the cluster size data, the cluster position data, and the cluster type data and mean error data associated with each of the plurality of clusters At block 503, the bank parameter determination module 203 of the analysis apparatus 101 may be configured to determine the at least one bank parameter 211 for each of the plurality of clusters. In an embodiment, the at least one bank parameter 211 may include at least one of error division data, number of errors and error pattern.

Figure 5C:
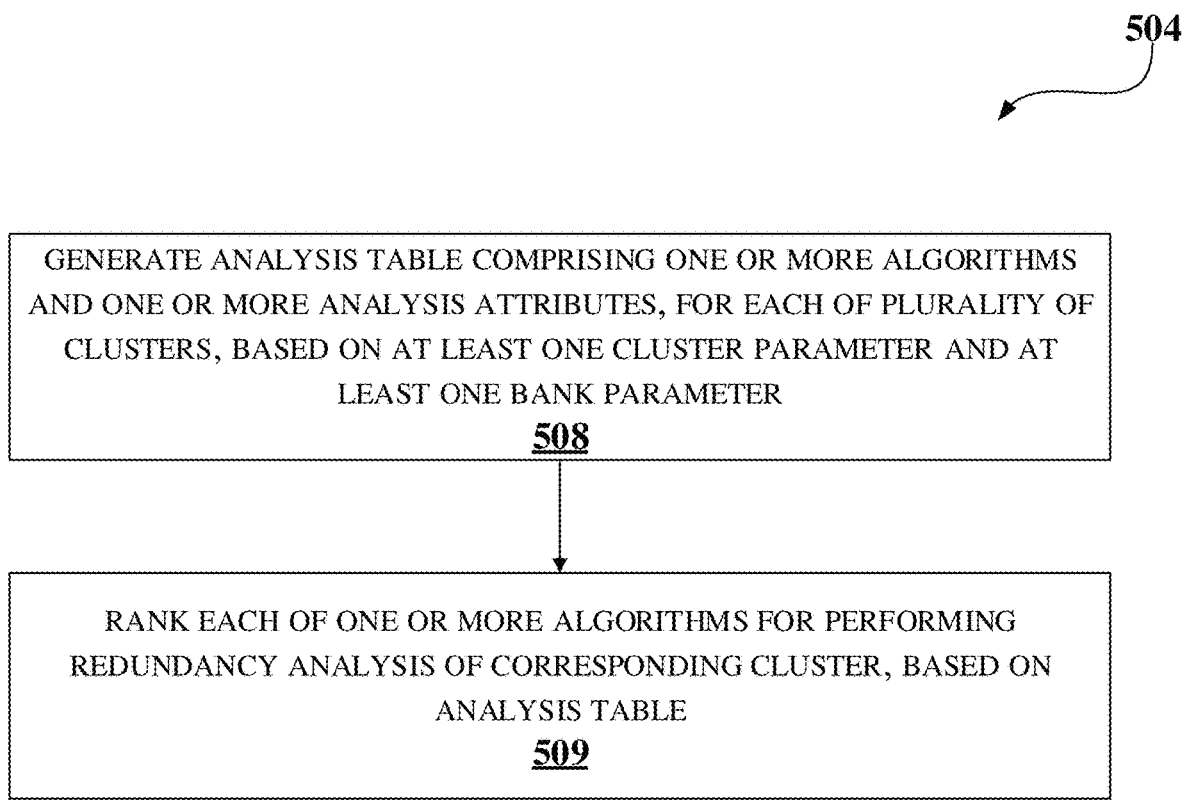
FIG. 5c shows a flow diagram illustrating example method for mapping one or more algorithms with plurality of clusters, in accordance with some embodiments of present disclosure.

At block 504, the algorithm map module 204 of the analysis apparatus 101 may be configured to map the one or more algorithms 212 with each of the plurality of clusters, based on the at least one cluster parameter 210 and the at least one bank parameter 211. FIG. 5*c* shows a flow diagram illustrating example method for mapping the one or more algorithms 212 with each of the plurality of clusters, in accordance with some embodiments of the present disclosure.

At block 508 of FIG. 5*c*, the algorithm map module 204 of the analysis apparatus 101 may be configured to generate the analysis table with the one or more algorithms 212 and one or more analysis attributes, for each of the plurality of clusters. The analysis table may be generated based on the at least one cluster parameter 210 and the at least one bank parameter 211.

At block 509 of FIG. 5*c*, the algorithm map module 204 of the analysis apparatus 101 may be configured to rank each of the one or more algorithms 212 for performing the redundancy analysis of corresponding cluster, based on the analysis table.

Referring back to FIG. 5*a*, at block 505, the redundancy analysis perform module 205 of the analysis apparatus 101 may be configured to perform the redundancy analysis of each of the plurality of banks in the semiconductor device. By performing the redundancy analysis, repair solutions for each of the plurality of banks may be identified.

Methods illustrated in FIGS. 5*a*, 5*b* and 5*c* may include one or more blocks for executing processes in at least one of the analysis apparatus 101. The methods illustrated in FIGS. 5*a*, 5*b* and 5*c* may be described in the general context of computer executable instructions. Generally, computer executable instructions can include routines, programs, objects, components, data structures, procedures, modules, and functions, which perform particular functions or implement particular abstract data types.

The order in which the methods illustrated in FIGS. 5*a*, 5*b* and 5*c* are described may not intended to be construed as a limitation, and any number of the described method blocks can be combined in any order to implement the method. Additionally, individual blocks may be deleted from the methods without departing from the scope of the subject matter described herein. Furthermore, the method can be implemented in any suitable hardware, software, firmware, or combination thereof.

An embodiment of the present disclosure is configured to provisions to analyze and improve repair efficiency of semiconductor devices, while decreasing time taken to repair the semiconductor device. The present disclosure may improve timings by finding a balance between the time complexity of the algorithm and efficiency of the algorithm.

An embodiment of the present disclosure proposes to improve yield of the wafer, as clustering will allow for a more thorough analysis of each wafer. Manufacturing errors in wafer batches, individual wafers, and photomasks can also be identified via pattern analysis and reported to allow for less errors in the next wafer batch.

An embodiment of the present disclosure proposes to decrease of probability of contamination of the wafer during in assembly line. The longer the wafer is in the assembly line the higher the chances of contamination. Therefore, with improvement in time taken for repair, as in the present disclosure not only allows for faster production of wafers, but also minimizes the probability of contamination of the wafer.

Computing System

Figure 6:
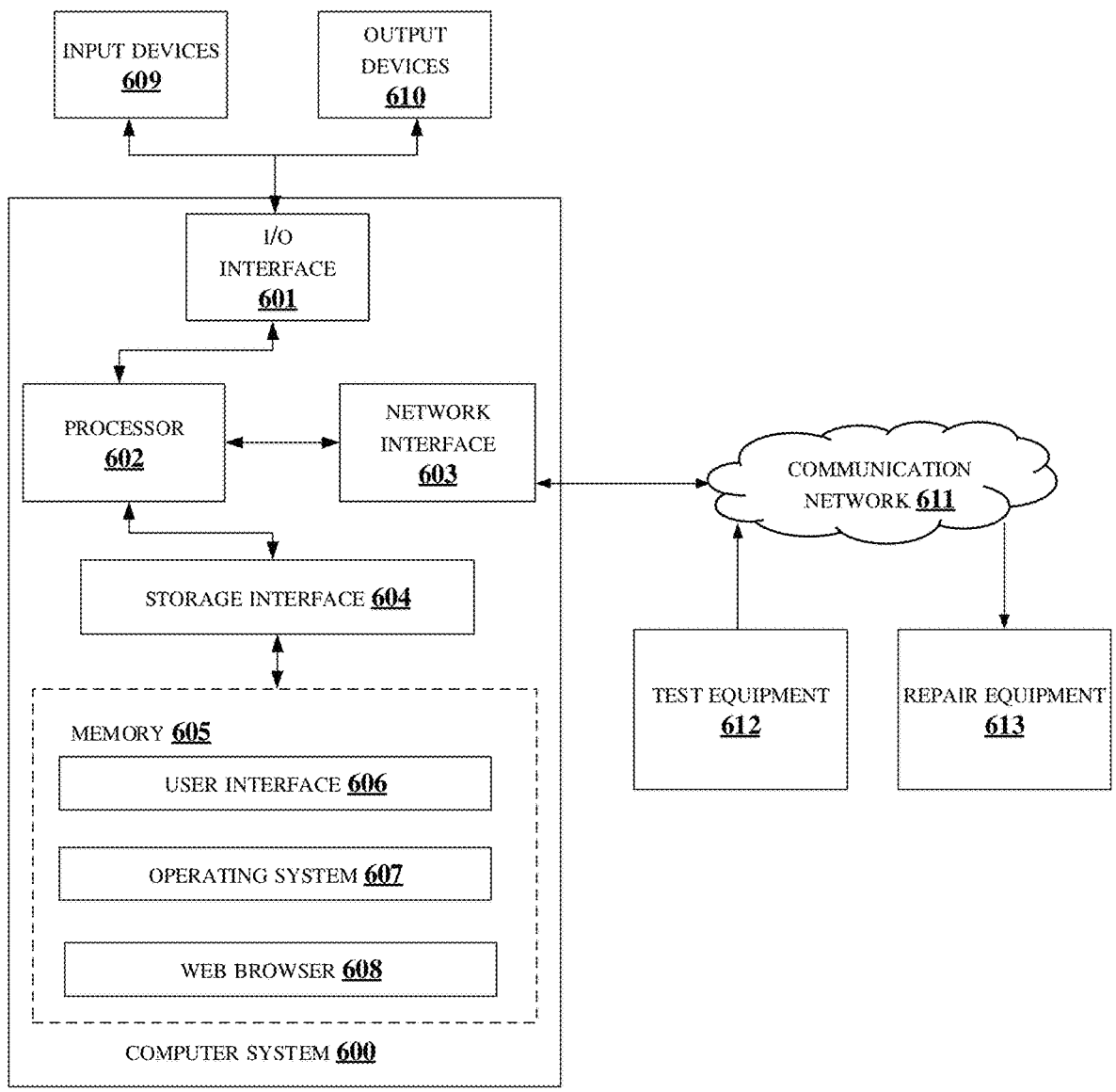
FIG. 6 illustrates a block diagram of an example computer system for implementing embodiments consistent with the present disclosure.

FIG. 6 illustrates a block diagram of an example computer system 600 for implementing embodiments consistent with the present disclosure. In an embodiment, the computer system 600 is used to implement the analysis apparatus 101. The computer system 600 may include a central processing unit ("CPU" or "processor") 602. The processor 602 may include at least one data processor for executing processes in Virtual Storage Area Network. The processor 602 may include specialized processing units such as, integrated system (bus) controllers, memory management control units, floating point units, graphics processing units, digital signal processing units, etc.

The processor 602 may be disposed in communication with one or more input/output (I/O) devices 609 and 610 via I/O interface 601. The I/O interface 601 may employ communication protocols/methods such as, without limitation, audio, analog, digital, monaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.n/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using the I/O interface 601, the computer system 600 may communicate with one or more I/O devices 609 and 610. For example, the input devices 609 may be an antenna, keyboard, mouse, joystick, (infrared) remote control, camera, card reader, fax machine, dongle, biometric reader, microphone, touch screen, touchpad, trackball, stylus, scanner, storage device, transceiver, video device/source, etc. The output devices 610 may be a printer, fax machine, video display (e.g., cathode ray tube (CRT), liquid crystal display (LCD), light-emitting diode (LED), plasma, Plasma Display Panel (PDP), Organic light-emitting diode display (OLED) or the like), audio speaker, etc.

In some embodiments, the computer system 600 may consist of the analysis apparatus 101. The processor 602 may be disposed in communication with a communication network 611 via a network interface 603. The network interface 603 may communicate with the communication network 611. The network interface 603 may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The communication network 611 may include, without limitation, a direct interconnection, local area network (LAN), wide area network (WAN), wireless network (e.g., using Wireless Application Protocol), the Internet, etc. Using the network interface 603 and the communication network 611, the computer system 600 may communicate with the test equipment 612 and the repair equipment 613, for repairing semiconductor devices. The network interface 603 may employ connection protocols include, but not limited to, direct connect, Ethernet (e.g., twisted pair 10/100/1000 Base T), transmission control protocol/internet protocol (TCP/IP), token ring, IEEE 802.11a/b/g/n/x, etc.

The communication network 611 includes, but is not limited to, a direct interconnection, an e-commerce network, a peer to peer (P2P) network, local area network (LAN), wide area network (WAN), wireless network (e.g., using Wireless Application Protocol), the Internet, Wi-Fi, and such. The first network and the second network may either be a dedicated network or a shared network, which represents an association of the different types of networks that use a variety of protocols, for example, Hypertext Transfer Protocol (HTTP), Transmission Control Protocol/Internet Protocol (TCP/IP), Wireless Application Protocol (WAP), etc., to communicate with each other. Further, the first network and the second network may include a variety of network devices, including routers, bridges, servers, computing devices, storage devices, etc.

In some embodiments, the processor 602 may be disposed in communication with a memory 605 (e.g., RAM, ROM, etc. not shown in FIG. 6) via a storage interface 604. The storage interface 604 may connect to memory 605 including, without limitation, memory drives, removable disc drives, etc., employing connection protocols such as, serial advanced technology attachment (SATA), Integrated Drive Electronics (IDE), IEEE-1394, Universal Serial Bus (USB), fibre channel, Small Computer Systems Interface (SCSI), etc. The memory drives may further include a drum, magnetic disc drive, magneto-optical drive, optical drive, Redundant Array of Independent Discs (RAID), solid-state memory devices, solid-state drives, etc.

The memory 605 may store a collection of program or database components, including, without limitation, user interface 606, an operating system 607, web browser 608 etc. In some embodiments, computer system 600 may store user/application data 606, such as, the data, variables, records, etc., as described in this disclosure. Such databases may be implemented as fault-tolerant, relational, scalable, secure databases such as Oracle® or Sybase®.

The operating system 607 may facilitate resource management and operation of the computer system 600. Examples of operating systems include, without limitation, APPLE MACINTOSH® OS X, UNIX®, UNIX-like system distributions (E.G., BERKELEY SOFTWARE DISTRIBUTION™ (BSD), FREEBSD™, NETBSD™, OPENBSD™, etc.), LINUX DISTRIBUTION™ (E.G., RED HAT™, UBUNTU™, KUBUNTU™, etc.), IBM™ OS/2, MICROSOFT® WINDOWS® (XP®, VISTA®/7/8, 10 etc.), APPLE® IOS™ GOOGLE® ANDROID®, BLACKBERRY® OS, or the like.

In some embodiments, the computer system 600 may implement a web browser 608 stored program component. The web browser 608 may be a hypertext viewing application, such as Microsoft® Internet Explorer, Google® Chrome, Mozilla® Firefox, Apple® Safari®, etc. Secure web browsing may be provided using Secure Hypertext Transport Protocol (HTTPS), Secure Sockets Layer (SSL), Transport Layer Security (TLS), etc. Web browsers 608 may utilize facilities such as AJAX, DHTML, Adobe® Flash, JavaScript®, Java®, Application Programming Interfaces (APIs), etc. In some embodiments, the computer system 600 may implement a mail server stored program component. The mail server may be an Internet mail server such as Microsoft Exchange, or the like. The mail server may utilize facilities such as ASP, ActiveX, ANSI C++/C #, Microsoft® .NET, CGI scripts, Java®, JavaScript®, PERL, PHP, Python, WebObjects, etc. The mail server may utilize communication protocols such as Internet Message Access Protocol (IMAP), Messaging Application Programming Interface (MAPI), Microsoft Exchange, Post Office Protocol (POP), Simple Mail Transfer Protocol (SMTP), or the like. In some embodiments, the computer system 600 may implement a mail client stored program component. The mail client may be a mail viewing application, such as Apple® Mail, Microsoft® Entourage, Microsoft® Outlook, Mozilla® Thunderbird, etc.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals (i.e. is non-transitory). Examples include Random Access Memory (RAM), Read-Only Memory (ROM), volatile memory, non-volatile memory, hard drives, CD ROMs, DVDs, flash drives, disks, and any other known physical storage media.

The described operations may be implemented as a method, system, or article of manufacture using standard programming and/or engineering techniques to produce software, firmware, hardware, or any combination thereof. The described operations may be implemented as code maintained in a "non-transitory computer readable medium," where a processor may read and execute the code from the computer readable medium. The processor is at least one of a microprocessor and a processor capable of processing and executing the queries. A non-transitory computer readable medium may include media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. Further, non-transitory computer-readable media may include all computer-readable media except for a transitory. The code implementing the described operations may further be implemented in hardware logic (e.g., an integrated circuit chip, Programmable Gate Array (PGA), Application Specific Integrated Circuit (ASIC), etc.).

An "article of manufacture" includes non-transitory computer readable medium, and/or hardware logic, in which code may be implemented. A device in which the code implementing the described embodiments of operations is encoded may include a computer readable medium or hardware logic. Of course, those skilled in the art will recognize that many modifications may be made to this configuration without departing from the scope of the invention, and that the article of manufacture may include suitable information bearing medium known in the art. The terms "an embodiment", "embodiment", "embodiments", "the embodiment", "the embodiments", "one or more embodiments", "some embodiments", and "one embodiment" mean "one or more (but not all) embodiments of the invention(s)" unless expressly specified otherwise.

A description of an embodiment with several components in communication with each other does not imply that all such components are required. On the contrary, a variety of optional components is described to illustrate the wide variety of possible embodiments of the invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices that are not explicitly described as having such functionality/features. Thus, other embodiments of the invention need not include the device itself.

The illustrated operations of FIGS. 6a and 6b show certain events occurring in a certain order. In alternative embodiments, certain operations may be performed in a different order, modified, or removed. Moreover, steps may be added to the above described logic and still conform to the described embodiments. Further, operations described herein may occur sequentially or certain operations may be processed in parallel. Yet further, operations may be performed by a single processing unit or by distributed processing units.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based here on. Accordingly, the disclosure of the embodiments of the invention is intended to be illustrative, but not limiting, of the scope of the invention, which is set forth in the following claims.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of performing redundancy analysis of a semiconductor device, the method comprising:
    classifying, by an analysis apparatus, at least one bank of a plurality of banks in a semiconductor device to be associated with a cluster from a plurality of clusters, wherein the classifying is based on one or more attributes associated with the plurality of banks;
    determining, by the analysis apparatus, at least one cluster parameter for the plurality of clusters;
    determining, by the analysis apparatus, at least one bank parameter for the at least one of the plurality of banks;
    mapping, by the analysis apparatus, one or more algorithms with the plurality of clusters, based on the at least one cluster parameter and the at least one bank parameter;
    performing, by the analysis apparatus, a redundancy analysis of the at least one bank of the plurality of banks in the plurality of clusters, based on the mapping,
    wherein the mapping of the one or more algorithms for the plurality of clusters comprises
        generating an analysis table comprising the one or more algorithms and one or more analysis attributes, for the plurality of clusters, based on the at least one cluster parameter and the at least one bank parameter, and
        ranking the one or more algorithms for a corresponding cluster based on the analysis table.

2. The method as claimed in claim 1, wherein the plurality of clusters is formed by clustering one or more banks from the plurality of banks, using a clustering technique.

3. The method as claimed in claim 1, wherein the one or more attributes comprises at least one of error position data, error rate data, error type data, and error pattern data associated with the at least one bank of the plurality of banks, and distance of the at least one bank of the plurality of banks from a centroid of the semiconductor device.

4. The method as claimed in claim 1, wherein the classifying the at least one bank of the plurality of banks comprises:
    computing cluster scores for the at least one bank of the plurality of banks with respect to the plurality of clusters; and
    classifying the at least one bank of the plurality of banks to be associated with a cluster amongst the plurality of clusters based on respective cluster scores, wherein the at least one bank of the plurality of banks correspond to the cluster relating to least value of a cluster score amongst the respective cluster scores.

5. The method as claimed in claim 1, wherein the at least one cluster parameter comprises at least one of cluster size data, cluster position data, cluster type data and mean error data associated with the plurality of clusters.

6. The method as claimed in claim 1, wherein the at least one bank parameter comprises at least one of error division data, number of errors and error pattern.

7. The method as claimed in claim 1, the method further comprising:
    identifying a repair solution from the redundancy analysis of the at least one bank.

8. An analysis apparatus for performing redundancy analysis of a semiconductor device comprising:
    a memory; and
    a processor coupled to the memory, the processor configured to,
        classify at least one bank of a plurality of banks in a semiconductor device to be associated with a cluster from a plurality of clusters, wherein the classifying is based on one or more attributes associated with the plurality of banks,
        determine at least one cluster parameter for the plurality of clusters,
        determine at least one bank parameter for the at least one bank of the plurality of banks,
        map one or more algorithms with the plurality of clusters, based on the at least one cluster parameter and the at least one bank parameter,
    perform a redundancy analysis of at least one bank in the plurality of clusters, based on the mapping,
    wherein the one or more algorithms is mapped for the plurality of clusters by
        generating an analysis table comprising the one or more algorithms and one or more analysis attributes, for the plurality of clusters, based on the at least one cluster parameter and the at least one bank parameter, and
        ranking the one or more algorithms based on the analysis table.

9. The analysis apparatus as claimed in claim 8, wherein the plurality of clusters is formed by clustering one or more banks from the plurality of banks, using a clustering technique.

10. The analysis apparatus as claimed in claim 8, wherein the one or more attributes comprises at least one of error position data, error type data, error rate data and error pattern data associated with the plurality of banks, and distance of the at least one bank of the plurality of banks from a centroid of the semiconductor device.

11. The analysis apparatus as claimed in claim 8, wherein the at least one bank of the plurality of banks is classified by:
    computing cluster scores for the at least one bank of the plurality of banks with respect to the plurality of clusters; and
    classifying the at least one bank of the plurality of banks to be associated with a cluster amongst the plurality of clusters based on respective cluster scores, wherein the at least one bank of the plurality of banks correspond to the cluster relating to least value of a cluster score amongst the respective cluster scores.

12. The analysis apparatus as claimed in claim 8, wherein the at least one cluster parameter comprises at least one of cluster size data, cluster position data, cluster type data, and mean error data associated with the plurality of clusters.

13. The analysis apparatus as claimed in claim 8, wherein the at least one bank parameter comprises at least one of error division data, number of errors and error pattern.

14. The analysis apparatus as claimed in claim 8, the processor is further configured to identify a repair solution from the redundancy analysis of the at least one bank.

15. A method of wafer scale redundancy analysis, the method comprising:
classifying at least one bank of a plurality of banks into at least one cluster from among a plurality of clusters based on at least one of position and error rate of at least one bank of the plurality of banks;
determining at least one cluster parameter for the at least one cluster;
determining at least one bank parameter for the classified bank;
selecting, from an Algorithm Map, an appropriate redundancy analysis algorithm for the classified bank based on the at least one cluster parameter and the at least one bank parameter; and
applying the selected redundancy analysis algorithm to the classified bank for identifying a repair solution for the classified bank,
wherein the selecting of the appropriate redundancy analysis algorithm for the classified bank comprises
generating an analysis table comprising one or more algorithms and one or more analysis attributes, for the plurality of clusters, based on the at least one cluster parameter and the at least one bank parameter, and
ranking the one or more algorithms for a corresponding cluster based on the analysis table.

16. The method as claimed in claim 15, the method further comprising:
identifying a repair solution from the redundancy analysis of the classified bank.

* * * * *